US012573870B2

(12) United States Patent
He et al.

(10) Patent No.: US 12,573,870 B2
(45) Date of Patent: Mar. 10, 2026

(54) BATTERY POWER CAPABILITY PREDICTION AND CORRECTION

(71) Applicant: Apple Inc., Cupertino, CA (US)

(72) Inventors: Wei He, Sunnyvale, CA (US); Jun Hou, San Jose, CA (US); Junyi Shen, Santa Clara, CA (US); Yiming Lou, Cupertino, CA (US); Nalin Chaturvedi, Union City, CA (US)

(73) Assignee: Apple Inc., Cupertino, CA (US)

( * ) Notice: Subject to any disclaimer, the term of this patent is extended or adjusted under 35 U.S.C. 154(b) by 1092 days.

(21) Appl. No.: 17/538,897

(22) Filed: Nov. 30, 2021

(65) Prior Publication Data

US 2023/0093677 A1     Mar. 23, 2023

Related U.S. Application Data

(60) Provisional application No. 63/247,037, filed on Sep. 22, 2021.

(51) Int. Cl.
| | |
|---|---|
| *H02J 7/00* | (2006.01) |
| *G01R 31/36* | (2020.01) |
| *G01R 31/367* | (2019.01) |
| *G01R 31/374* | (2019.01) |
| *G01R 31/3835* | (2019.01) |
| *G01R 31/3842* | (2019.01) |
| *G01R 31/389* | (2019.01) |
| *G01R 31/392* | (2019.01) |

(Continued)

(52) U.S. Cl.
CPC .... *H02J 7/007182* (2020.01); *G01R 31/3648* (2013.01); *G01R 31/367* (2019.01); *G01R 31/374* (2019.01); *G01R 31/3835* (2019.01);

*G01R 31/392* (2019.01); *G06F 1/3212* (2013.01); *H02J 7/00306* (2020.01); *H02J 7/005* (2020.01); *H02J 7/00712* (2020.01); *G01R 31/382* (2019.01); *G01R 31/3842* (2019.01); *G01R 31/389* (2019.01); *H02J 7/00* (2013.01); *H02J 7/0047* (2013.01); *H02J 7/0048* (2020.01); *Y02E 60/10* (2013.01)

(58) Field of Classification Search
CPC .. H02J 7/007182; H02J 7/00306; H02J 7/005; H02J 7/00712; H02J 7/00; H02J 7/0047; H02J 7/0048; G01R 31/3648; G01R 31/367; G01R 31/374; G01R 31/3835; G01R 31/392; G01R 31/382; G01R 31/3842; G01R 31/389; G06F 1/3212; Y02E 60/10
USPC ......................................................... 320/124
See application file for complete search history.

(56) References Cited

U.S. PATENT DOCUMENTS

| | | | |
|---|---|---|---|
| 10,830,821 B2 | 11/2020 | Lou et al. | |
| 2015/0316618 A1* | 11/2015 | Lou ...................... | G01R 31/367 702/63 |

(Continued)

*Primary Examiner* — Julian D Huffman
*Assistant Examiner* — Nathan J Instone
(74) *Attorney, Agent, or Firm* — FLETCHER YODER PC

(57) ABSTRACT

Based on changes in a battery (e.g., age, temperature) of an electronic device, battery power prediction and correction logic of the electronic device may correct a power capability and/or regulate power associated with the battery. For example, the battery power prediction and correction logic may operate the battery to supply up to a maximum of a power capability with an applied correction factor based on a voltage measurement and a cutoff voltage associated with the battery.

20 Claims, 10 Drawing Sheets

(51) Int. Cl.
      *G06F 1/3212*              (2019.01)
      *G01R 31/382*            (2019.01)

(56)                          References Cited

U.S. PATENT DOCUMENTS

2018/0345812  A1 *   12/2018   Chaturvedi  .......... G01R 31/392
2021/0206291  A1 *    7/2021   Gibeau  .............. H02J 7/00036

* cited by examiner

BATTERY POWER CAPABILITY PREDICTION AND CORRECTION

CROSS-REFERENCE TO RELATED APPLICATIONS

This application claims priority to U.S. Application No. 63/247,037, entitled "Battery Power Capability Prediction and Correction," filed Sep. 22, 2021, which is hereby incorporated by reference in its entirety for all purposes.

BACKGROUND

The present disclosure relates generally to powering an electronic device, and more specifically to battery state-of-charge and regulating power associated with the electronic device.

A battery having certain power capabilities may power an electronic device, and operations of the electronic device may be performed based on a power capability (e.g., maximum power limit) of the battery. As battery parameters vary in certain conditions (e.g., in extremely hot or cold environments versus room temperature), a battery model may facilitate determining and/or optimizing battery parameters, such as current, voltage, state of charge, and so forth to predict the power capability. The battery may supply power to the electronic device according to the power capability determined based on the battery model. For example, based on determining a reduced power capability, the electronic device may operate in a low power mode and/or default to limiting computationally intensive operations so that power consumption by the electronic device does not exceed the reduced power capability. The electronic device may also include an indicator for the remaining charge of the battery based on the power capability.

Over time, as the battery ages, power capability and performance of the battery may degrade. As such, the battery model may no longer be applicable with respect to the aging battery, and thereby the power capability according to the battery model may no longer be accurate. The battery model may not be able to update in time, or at all, to account for new conditions of the battery (e.g., aging battery) or environments for which the electronic device is operating. If the remaining charge, and thereby the power capability, is estimated inaccurately based on the battery model, user experience associated with the electronic device may be impacted. For example, if the remaining charge and the power capability are underestimated, then the electronic device may unnecessarily or prematurely enter a low power mode (e.g., limiting computationally intensive operations or reducing quality of operations to prevent exceeding the power capability), even though the battery may have sufficient charge to operate in a full or normal power mode (e.g., without the lower power mode). A user may experience lower resolutions, slower refresh rates, reduced screen brightness, and so forth, when operating the electronic device if the power capability is predicted to be lower than an actual power capability of the electronic device (e.g., power capability deemed lower than a determined power of the electronic device) at a given time.

On the other hand, if the power capability and the remaining charge is overestimated, then the electronic device may continue performing operations in a normal power mode (e.g., which may allow a higher number of computationally intensive functions compared to the low power mode), even though the battery may not have sufficient charge to enable the electronic device to operate in the normal power mode. The electronic device may continue performing computationally intensive operations (e.g., video calling) without switching to a low power mode if the power capability is predicted to be greater than an actual power capability of the electronic device (e.g., power capability deemed greater than a determined power of the electronic device) at a given time. Because the electronic device continues to perform computationally intensive operations without sufficient charge, the electronic device may eventually shut down without the user receiving an indication of low charge of the battery. Had the power capability and the remaining charge been predicted accurately, the electronic device may have defaulted to operating under low power mode, and the user may have received a notification of low charge of the battery. The user may have recharged the battery and/or limited computationally intensive operations based on the notification of low charge.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, an electronic device includes a power source and a processor communicatively coupled to the power source. The processor may receive a voltage measurement and a cutoff voltage associated with the power source. The cutoff voltage is associated with power regulation of the power source. The processor may also receive a power capability of the power source based on the cutoff voltage, the voltage measurement, and a duration of time that the power source is expected to operate by supplying up to a maximum of the power capability. The processor may operate the power source to supply up to the maximum of the power capability with an applied correction factor.

In another embodiment, a non-transitory computer-readable medium includes computer-executable instructions that, when executed by one or more processors, cause the one or more processors to: receive a voltage measurement associated with a battery, a cutoff voltage associated with power regulation of the battery, and a power capability associated with the battery; perform a first order correction of the power capability (e.g., applying a correction factor) based on determining that the voltage measurement is less than the cutoff voltage; perform a second order correction of the power capability (e.g., applying another correction factor) based on determining that the voltage measurement is equal to the cutoff voltage; and operate the battery to supply up to the maximum of the power capability according to the first order correction or the second order correction.

In yet another embodiment, a system includes a computing device powered by a battery and battery power prediction and correction circuitry. The computing device includes one or more sensors that capture a voltage measurement associated with the battery. The battery power prediction and correction circuitry may determine a power capability with an applied correction factor based at least in part on a cutoff voltage associated with power regulation of the battery and a duration of time that the battery is expected to operate by supplying up to a maximum of the power capability. The battery power prediction and correction circuitry may also output the power capability with the applied correction factor.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
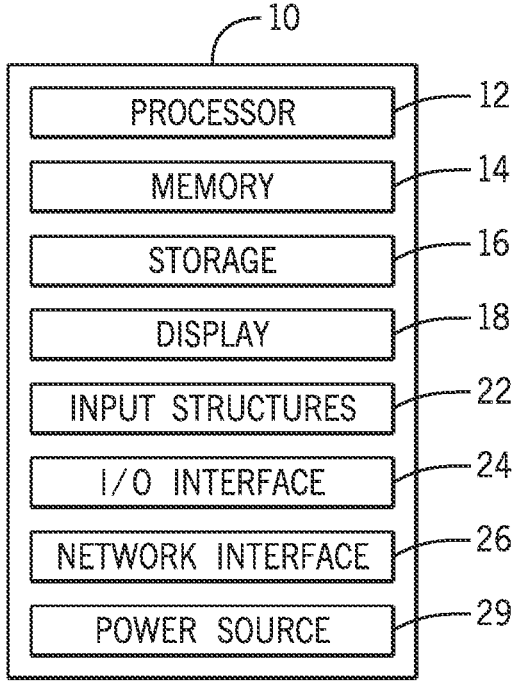
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to receiving, determining, and/or predicting a power capability of a battery of an electronic device, as well as correcting the power capability and/or regulating power based on impedance errors or errors between the power capability and a determined power of the battery at a given time. It should be understood that the power of the battery may be determined by measuring or detecting a voltage of the battery, measuring or detecting a current of the battery, and determining a product of the measured voltage and the measured current. As used herein, the electronic device may include a phone, tablet, laptop, or other portable electronic device. Further, the power capability refers to a maximum amount of power that the battery can supply or output, or is expected to supply or output, to the electronic device at a given time. The electronic device may include a processor (e.g., including battery power capability prediction and correction logic) that collects various system information of the electronic device to determine the power capability and regulate power based on parameters of the battery (e.g., measured current, measured voltage, state of charge) and operating characteristics of the electronic device (e.g., whether electronic device is operating in an extreme or remote environment or performing computationally intensive operations).

To prevent underestimating and/or overestimating the power capability and to ensure a desirable user experience associated when a user is operating the electronic device, it may be useful to determine an accurate power capability or regulate battery power based on certain characteristics of the battery (e.g., aging battery, temperature of battery), especially when the battery model is not capable of timely updating based on certain characteristics. In this way, the electronic device may provide the user with an accurate power capability or an indication of remaining charge of the battery.

In some embodiments, the processor of the electronic device may implement or perform an algorithm to determine the power capability. According to the algorithm and based on impedance errors or errors between the power capability and a measured power of the battery at a given time, the electronic device may regulate battery power and/or determine the power capability with an applied correction factor. In addition or as an alternative to the battery model, the processor may use a cutoff voltage (e.g., voltage associated with battery power regulation) and a predictive horizon (e.g., a duration of time that the battery is expected to operate by supplying a maximum of or up to the maximum of the power capability) to determine the power capability or the power capability with an applied correction factor. As described in detail below, the processor may evaluate a voltage measurement of the battery relative to the cutoff voltage to determine the power capability or the power capability with an applied correction factor. For example, when the voltage measurement is greater than the cutoff voltage, the processor may operate the battery to supply the power capability (e.g., up to a maximum or the maximum of the power capability). Further, when the voltage measurement is less than or equal to the cutoff voltage, the processor may operate the battery to supply the power capability with the applied correction factor (e.g., up to a maximum or the maximum of the power capability with the applied correction factor). Even as a battery ages, based at least on the cutoff voltage and the predictive horizon, the processor may accurately determine the power capability or the power capability with the applied correction factor.

The algorithm may also use outputs of the battery model to determine the power capability or the power capability with the applied correction factor. As used herein, the battery model may refer to electrical characteristics of the battery being modeled as a resistor-capacitor (RC) circuit based on certain parameters, such as resistance associated with the battery, capacitance associated with the battery, and/or a time constant (e.g., an amount of time to charge or discharge a resistor-capacitor (RC) component of the battery). For example, the time constant may be between 4, 5, or any suitable time constant to fully charge or discharge a capacitor associated with the battery. A battery state or state of charge may be estimated from the battery model. Along with the battery model, a current measurement and a voltage measurement of the battery may serve as inputs for the algorithm to determine a battery state estimation.

The battery state estimation includes an internal current for each equivalent resistor-capacitor (RC) component associated with the battery as well as a state of charge (SOC), which may include a level of available charge of the battery relative to a charge capability (e.g., maximum charge) of the battery. As indicated above, to account for inaccuracies or lack of updates in the battery model, the algorithm may also receive or determine a cutoff voltage and a predictive horizon to determine the power capability and regulate the power. The predictive horizon may refer to a duration of time that the battery is expected to operate by supplying an increased power, up to a maximum power of the power capability, or the maximum of the power capability (e.g., maximum power limit). The cutoff voltage refers to a voltage of the battery at which power regulation occurs. In some cases, when the voltage measurement of the battery is a threshold level below the cutoff voltage, the battery may be considered discharged and/or the electronic device may automatically shut down.

When the voltage measurement is less than or equal to the cutoff voltage, the processor (e.g., using the algorithm) initiates battery power regulation such that the power capability is reduced or lower than a battery power measurement to ensure the voltage measurement is above the cutoff voltage. In some cases, if the voltage measurement is less than or equal to the cutoff voltage, and the power is not regulated or a correction factor is not applied to the power capability, then the electronic device may continue operating in a normal power mode. Further, if the voltage measurement is less than or equal to the cutoff voltage, and the power is not regulated until after a time delay, then the electronic device may continue operating in a normal power mode for a period of time before switching to a low power mode. In both cases, because the electronic device continues operating in a normal power mode even though the battery does not have a sufficient amount of charge to support operations in normal power mode, the electronic device may eventually shut down without notifying the user of a low charge of the battery. In other cases, if the power is regulated or a correction factor is applied to the power capability even though the voltage measurement is greater than the cutoff voltage, then the processor may unnecessarily reduce power usage supplied by the battery and/or prematurely send a low charge notification to a user.

In addition to receiving or determining the power capability, the processor may regulate battery power (e.g., operate the battery to supply the power capability with an applied correction factor) in response to determining that the voltage measurement of the battery is less than or equal to the cutoff voltage. That is, to prevent power consumption by the electronic device from exceeding the power capability, unexpected shutdowns of the electronic device, premature delivery of low charge notifications, and unnecessary reduction in power supplied to the electronic device, the processor may evaluate the cutoff voltage and the voltage measurement of the battery relative to the power capability and the power measurement of the battery to regulate power. For example, when the voltage measurement is less than the cutoff voltage, the processor may regulate the power (e.g., apply a correction factor to the power capability) such that the power capability with the applied correction factor is lower (e.g., much lower) than the power measurement of the battery by a first threshold amount. The power capability with applied correction factor that is lower than the power measurement by the first threshold amount (e.g., 30%, 50%, 70%) allows the voltage measurement to increase to prevent unexpected shutdowns of the electronic device as described above.

When the voltage measurement is equal to the cutoff voltage, the processor may regulate the power (e.g., apply a correction factor to the power capability) such that the power capability with the applied correction factor is lower than the power measurement of the battery by a second threshold amount that is less than the first threshold amount. Reducing the power capability such that the reduced power capability is less than the power measurement by the second threshold amount (e.g., 1%, 5%, 10%) prevents the voltage measurement from dropping below the cutoff voltage. In some cases, if the voltage measurement is close to the cutoff voltage, the processor may regulate battery power such that the power capability is also close to the power measurement. That is, the processor may correct the power capability such that the difference in magnitude between the power capability with the applied correction factor and the power measurement equals the difference in magnitude between the voltage measurement and the cutoff voltage. When the voltage measurement is greater than the cutoff voltage, the processor may determine the power capability without applying a correction factor, where the power capability is greater than the power measurement of the battery.

As later discussed, the processor may also determine the power capability and/or the power capability with the applied correction factor based on a battery equivalent impedance and a battery equivalent open-circuit voltage (EOCV). The battery equivalent impedance refers to a resistance and reactance associated with the battery according to the resistor-capacitor (RC) circuit. The battery equivalent open-circuit voltage (EOCV) refers to a potential difference between positive and negative terminals of the battery without external current flowing between the positive and negative terminals, where the potential difference is converted across resistor-capacitor (RC) components associated with the battery.

FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29 (e.g., battery). The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies. In some embodiments, the processor 12 may display or otherwise output the power capability, the power capability with the applied correction factor, an indicator of remaining charge associated with the electronic device, a notification of low charge associated with the electronic device, and so forth via the display 18.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth. The power source 29 of the electronic device 10 may include any suitable source of power, such as a rechargeable lithium polymer (Li-poly) battery and/or an alternating current (AC) power converter.

Figure 2:
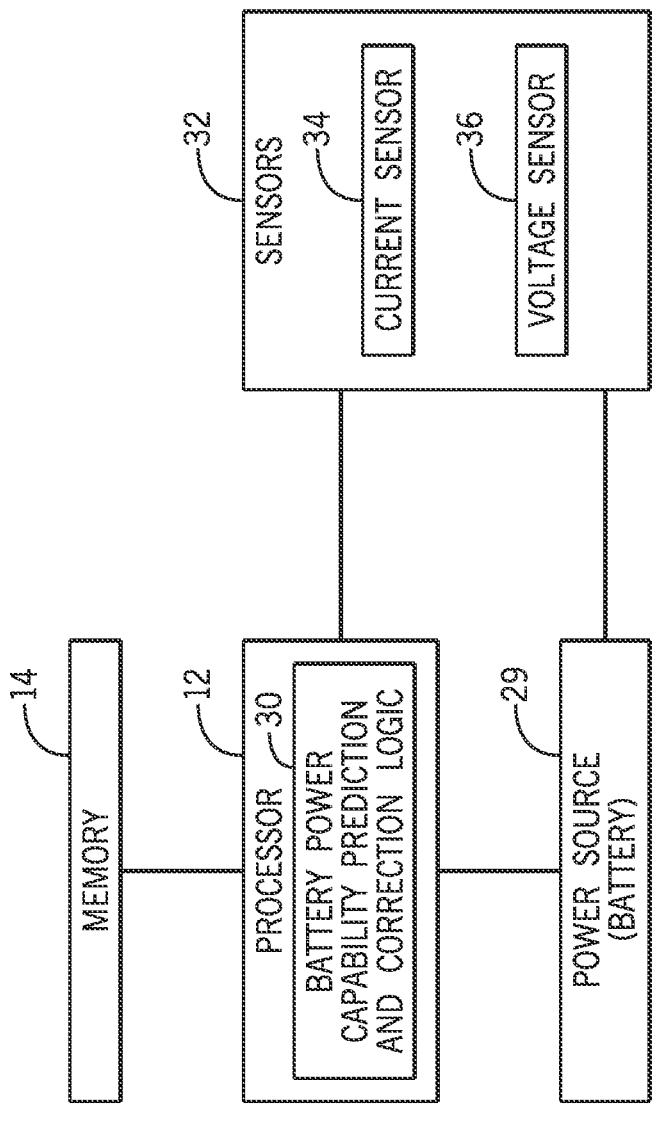
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the power source (e.g., battery) 29, and/or sensors 32 may be communicatively coupled directly or indirectly (e.g., through or via another component, a communication bus, a network) to one another to transmit and/or receive data between one another.

The processor 12 may include battery power capability prediction and correction logic 30 that determines a power capability (e.g., how much power the power source or battery 29 is capable of outputting) of the battery 29 and regulates the battery 29 based on a power target 56, impedance error, or errors between the power capability and a power measurement of the battery 29. In particular, the battery power capability prediction and correction logic 30 may collect various system information or operating characteristics (e.g., cutoff voltage, predictive horizon, current measurement, voltage measurement, power measurement, temperature of battery, age of battery) of the battery 29 and determine a power capability or a power capability with an applied correction factor based on the collected system information or operating characteristics. In some embodiments, the battery power capability prediction and correction logic 30 may include a machine-learning engine that can be implemented in the processor 12 and/or the memory 14. In other embodiments, the battery power capability prediction and correction logic 30 and the machine-learning engine may be implemented at least in part in other circuitry (e.g., other processing circuitry) or other hardware components that are separate from the processor 12. Moreover, the battery power capability prediction and correction logic 30 and the machine-learning engine may be implemented at least in part as software, and, as such, may be stored on the memory 14, in the cloud, or as a software as a service (SAAS). Indeed, any or all of the battery power capability prediction and correction logic 30 and the machine-learning engine may be implemented as logic, and thus may include hardware components (e.g., circuitry), software components (e.g., machine-executable instructions), or a combination of both.

Depending on the inferences to be made (e.g., determining power capability or power capability with an applied correction factor, regulating battery power), the battery power capability prediction and correction logic 30 may implement different forms of machine-learning. For example, in some embodiments (e.g., when particular known examples exist that correlate to future predictions or estimates that the machine-learning engine may be tasked with generating), a machine-learning engine may implement supervised machine-learning. In supervised machine-learning, a mathematical model of a set of data contains both inputs and desired outputs. This data is referred to as "training data" and may include a set of training examples. Each training example may have one or more inputs and a desired output, also known as a supervisory signal. In a mathematical model, each training example is represented by an array or vector, sometimes called a feature vector, and the training data is represented by a matrix. Through iterative optimization of an objective function, supervised learning algorithms may learn a function that may be used to predict an output associated with new inputs. An optimal function may allow the algorithm to correctly determine the output for inputs that were not a part of the training data. An algorithm that improves the accuracy of its outputs or predictions over time is said to have learned to perform that task.

Supervised learning algorithms may include classification and regression techniques. Classification algorithms may be used when the outputs are restricted to a limited set of values, and regression algorithms may be used when the outputs have a numerical value within a range. Similarity learning is an area of supervised machine-learning closely related to regression and classification, but the goal is to learn from examples using a similarity function that measures how similar or related two objects are. Similarity learning has applications in ranking, recommendation systems, visual identity tracking, face verification, and speaker verification.

Additionally and/or alternatively, in some situations, it may be beneficial for the machine-learning engine to utilize unsupervised learning (e.g., when particular output types are not known). Unsupervised learning algorithms take a set of data that contains only inputs, and find structure in the data, like grouping or clustering of data points. The algorithms, therefore, learn from test data that has not been labeled, classified, or categorized. Instead of responding to feedback, unsupervised learning algorithms identify commonalities in the data and react based on the presence or absence of such commonalities in each new piece of data.

That is, the machine-learning engine may implement cluster analysis, which is the assignment of a set of observations into subsets (called clusters) so that observations within the same cluster are similar according to one or more predesignated criteria, while observations drawn from different clusters are dissimilar. Different clustering techniques make different assumptions on the structure of the data, often defined by some similarity metric and evaluated, for example, by internal compactness, or the similarity between members of the same cluster, and separation, the difference between clusters. In additional or alternative embodiments, the machine-learning engine may implement other machine-learning techniques, such as those based on estimated density and graph connectivity.

The electronic device 10 may also include sensors 32. Non-limiting examples of the sensors 32 may include a current sensor 34 and a voltage sensor 36. Data acquired from the sensors 32 may facilitate the processor 12 in determining characteristics such as current, voltage, and temperature associated with the battery 29 of the electronic device 10. Using a current measurement acquired from the current sensor 34 and a voltage measurement acquired from the voltage sensor 36, the processor 12 may determine a power measurement associated with the battery 29. In some embodiments, the processor 12 may receive the power measurement from a power sensor of the electronic device 10. Data such as electrical characteristics, age, temperature (e.g., acquired from a temperature sensor) associated with the battery 29 may serve as inputs for the battery power capability prediction and correction logic 30 (e.g., algorithm) implemented by the processor 12 to estimate the power capability and/or regulate power of the power source 29 by applying a correction factor to the power capability.

The various components of the electronic device 10 may be coupled together by a bus system. The bus system may include a data bus, for example, as well as a power bus, a control signal bus, and a status signal bus, in addition to the data bus. The components of the electronic device 10 may be coupled together or accept or provide inputs to each other using some other mechanism.

Figure 3:
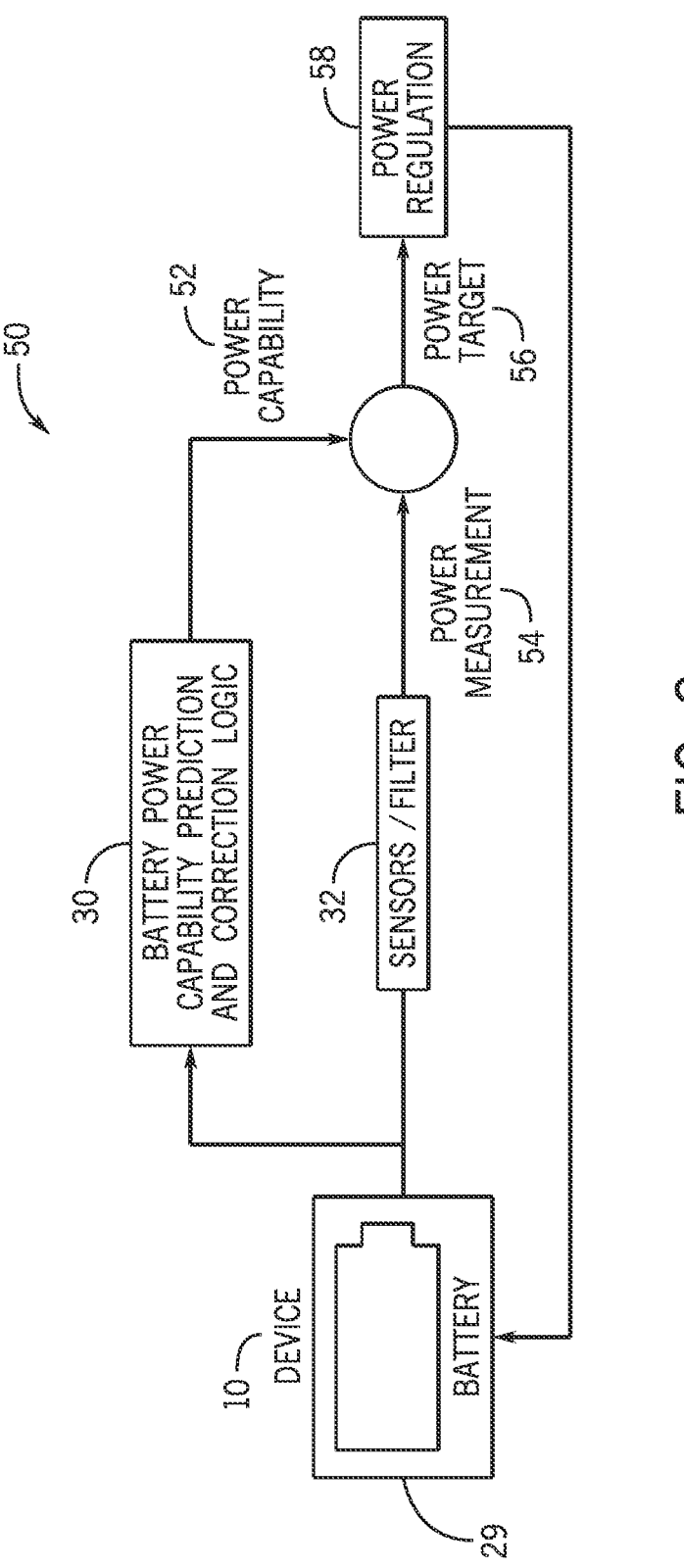
FIG. 3 is a flow diagram associated with determining a battery power capability and/or regulating battery power of a battery of the electronic device of FIG. 1, according to embodiments of the present disclosure.

With the preceding in mind, FIG. 3 is a flow diagram associated with the battery power capability prediction and correction logic 30 determining a power capability 52 of the battery 29 and/or implementing power regulation 58 (e.g., causing the battery 29 to supply up to a maximum or the maximum of the power capability 52 with an applied correction factor) of the battery 29, according to embodiments of the present disclosure. In some embodiments, the battery power capability prediction and correction logic 30 may be external to the processor 12, and the processor 12 may receive the power capability 52 from the battery power capability prediction and correction logic 30. In other embodiments, the processor 12 may determine (e.g., predict, estimate) the power capability 52 using the battery power capability prediction and correction logic 30 disposed within the processor 12. The inputs and steps that the battery power capability prediction and correction logic 30 uses to determine the power capability 52 or the power capability 52 with the applied correction factor will be discussed in more detail in FIGS. 6-8. The electronic device 10 may also include sensors 32 (e.g., current sensor 34, voltage sensor 36) that acquire current and voltage measurements used to determine a power measurement 54 of the battery 29. In some embodiments, a power sensor and/or a filter (e.g., one or more line filters and/or frequency filters) may be used to receive or determine the power measurement 54.

At a given time, based on the power target 56, impedance errors, or errors between the power capability 52 (e.g., estimated maximum power limit) and the power measurement 54, the processor 12 may initiate power regulation 58 of the battery 29. In certain situations (e.g., when a voltage measurement is less than or equal to a cutoff voltage of the battery 29), the processor 12 (e.g., using the battery power capability prediction and correction logic 30) may cause the battery 29 to supply the power capability 52 with an applied correction factor. Providing an accurate power capability 52 (e.g., power capability 52 with the applied correction factor) improves user experience associated with the electronic device 10. For example, if the processor 12 receives a power capability 52 that is lower than the power measurement 54 (e.g., an underestimated power capability 52), the processor 12 may cause the electronic device 10 to operate in low power mode even though the battery 29 may have sufficient charge for the electronic device 10 to operate in a normal power mode. Further, based on the underestimated power capability 52, the processor 12 may prematurely provide a user with a low power notification via the display 18 of the electronic device 10. Based on the low power notification, the user may presume that the electronic device 10 is low in charge, recharge the battery 29, or reduce computationally intensive operations. Operating the electronic device 10 in a low power mode may negatively impact user experience, despite the battery 29 having a sufficient amount of charge to enable the electronic device 10 to perform operations in normal power mode.

On the other hand, if the processor 12 receives a power capability 52 that is higher than the power measurement 54 (e.g., an overestimated power capability 52), the processor 12 may cause the electronic device 10 to continue performing operations in a normal power mode even though the battery 29 may not have sufficient charge to operate according to the normal power mode. Because the electronic device 10 continues to perform computationally intensive operations without sufficient charge, the electronic device 10 may eventually shut down without the user receiving an indication of low charge of the battery 29. In both scenarios (e.g., underestimated and overestimated power capability 52), it may be useful to regulate battery power and provide the user with a corrected power capability 52 (e.g., power capability 52 with applied correction factor) to prevent a negative user experience with the electronic device 10. Accordingly, based on the power target 56, impedance errors, errors between the power capability 52 and the power measurement 54 of the battery 29, the processor 12 may perform power regulation 58 of the battery 29 to correct the power capability 52. That is, the processor 12 may provide an accurate measure of power capability 52 (e.g., power capability 52 with applied correction factor) to the user based on changes in characteristics of the battery (e.g., older battery).

Figure 4A:
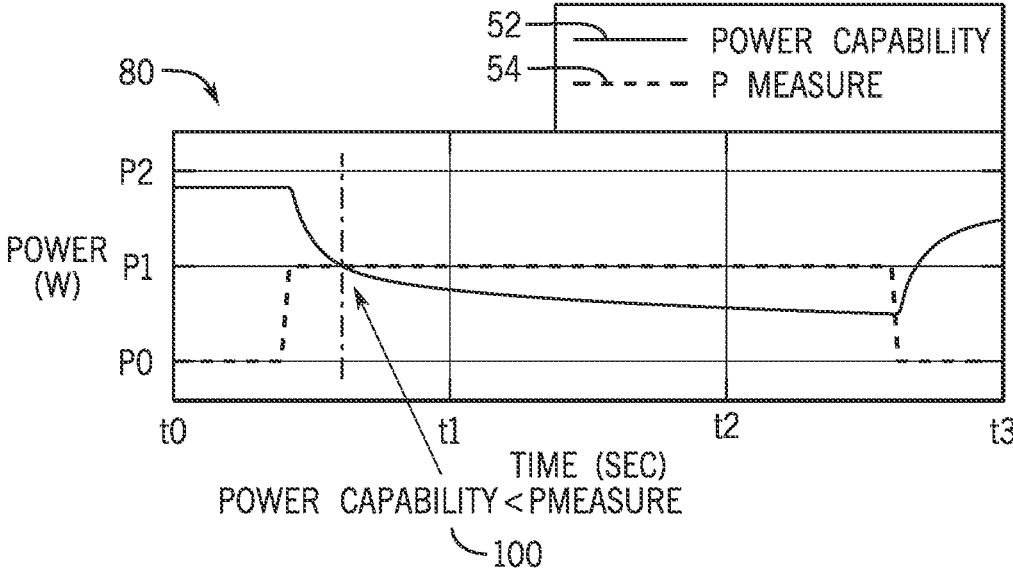
FIG. 4A illustrates power and voltage graphs associated with a battery of the electronic device of FIG. 1 regulating battery power when a battery voltage measurement is less than a battery cutoff voltage.
Figure 4A:
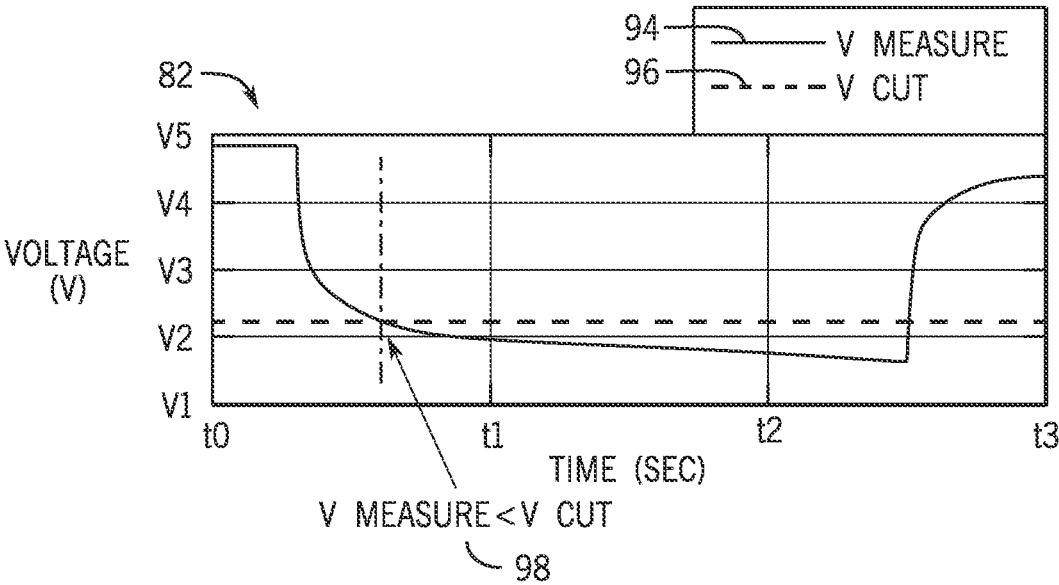

FIG. 4A illustrates a power graph 80 and a voltage graph 82 associated with regulating battery power when a voltage measurement 94 is less than or equal to the cutoff voltage 96 to ensure increased or optimal performance of the electronic device 10, according to embodiments of the present disclosure. As indicated by intersection 98 in the voltage graph 82, when the voltage measurement 94 is equal to or begins to drop below the cutoff voltage 96, the processor 12 appropriately initiates power regulation 58 of the battery 29. In this case, the power regulation 58 includes correcting the power capability 52 such that the power capability 52 with an applied correction factor is lower than the power measurement 54 of the battery 29 (as depicted by intersection 100 in the power graph 80). As mentioned above, if the voltage measurement 94 remains below the cutoff voltage 96 for a period of time, the electronic device 10 may eventually shut down. By correcting the power capability 52 (e.g., reducing the power capability 52 such that the reduced power capability 52 is less than the power measurement 54), the voltage measurement 94 may increase, and thereby prevent potential shut down of the electronic device 10. Because the battery power is regulated when the voltage measurement 94 is less than or equal to the cutoff voltage 96, the electronic device 10 may perform at increased or optimal conditions based on the power capability 52 with the applied correction factor. That is, when intersection 100 (e.g., when power capability 52 begins to decrease such that the reduced power capability 52 is less than the power measurement 54) is aligned with intersection 98 (e.g., when the voltage measurement 94 begins to decrease such that the voltage measurement 94 is less than the cutoff voltage 96), the processor 12 effectively performs power regulation 58 such that the electronic device 10 may operate under suitable conditions.

Figure 4B:
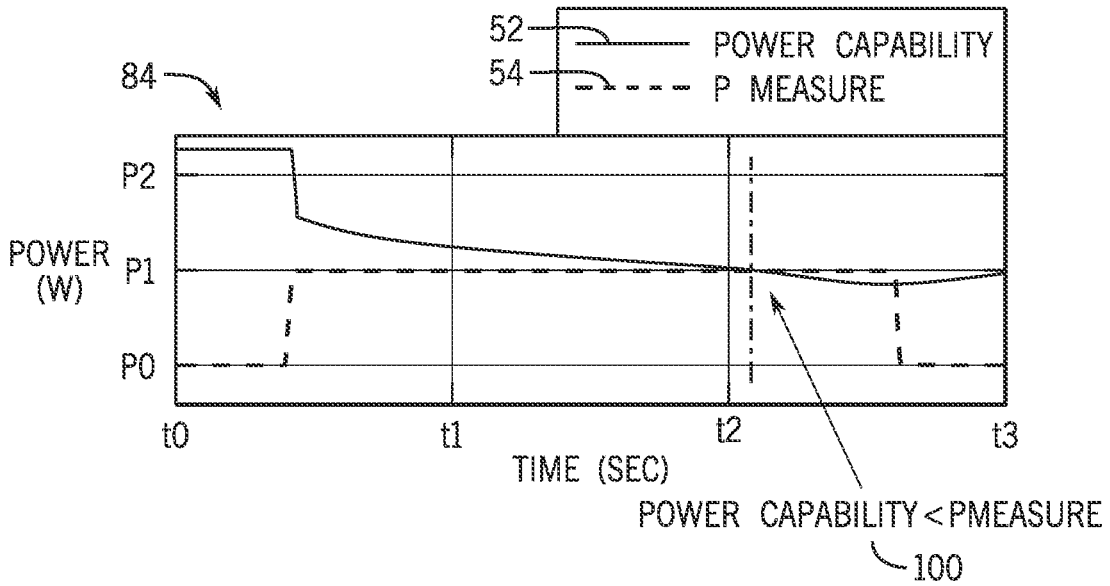
FIG. 4B illustrates power and voltage graphs associated with a battery of the electronic device of FIG. 1 regulating battery power after a period of time since a battery voltage measurement has been less than a battery cutoff voltage.
Figure 4B:
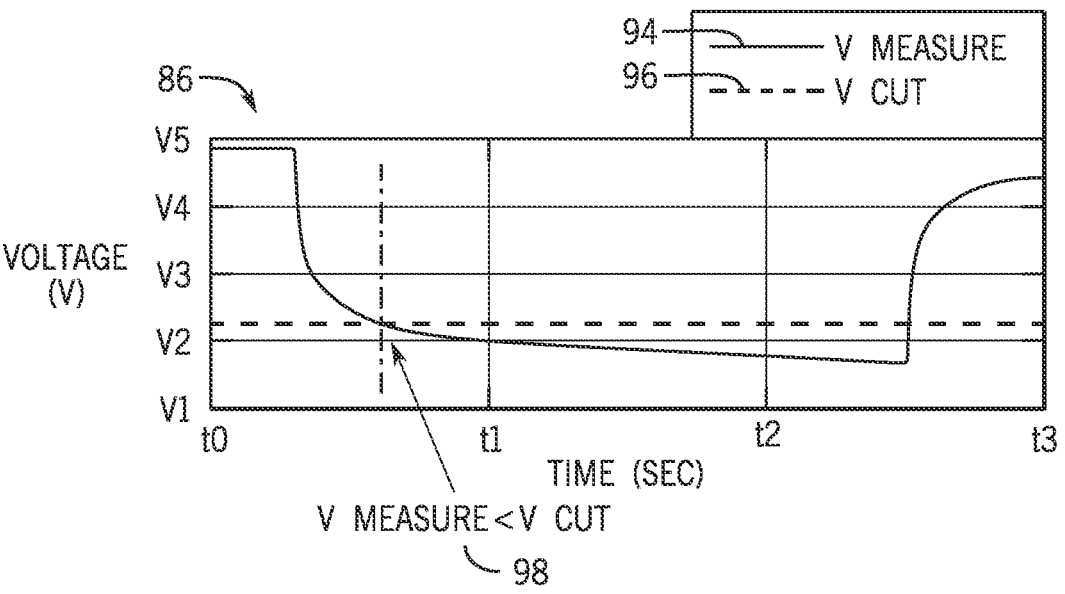

FIG. 4B illustrates a power graph 84 and a voltage graph 86 associated with the battery 29 based on regulating battery power after the voltage measurement 94 has been less than the cutoff voltage 96 for a period of time, according to embodiments of the present disclosure. That is, the processor 12 may regulate power after a time delay (e.g., approximately 3, 5, 10, and so forth, seconds since the voltage measurement 94 has been less than the cutoff voltage 96). As illustrated in the power graph 84 and the voltage graph 86, the intersection 100 (e.g., when power capability 52 begins to decrease such that the reduced power capability 52 is less than the power measurement 54) occurs after the intersection 98 (e.g., when the voltage measurement 94 begins to decrease such that the voltage measurement 94 is less than the cutoff voltage 96). By delaying power regulation 58 (e.g., intersection 100 occurring after intersection 98), the electronic device 10 may be susceptible to unexpected shutdowns since the voltage measurement 94 is less than the cutoff voltage 96 for an extended period of time. That is, the processor 12 may cause the electronic device 10 to continue performing operations in a normal power mode before switching to a low power mode. In some embodiments, upon delaying the switch to the low power mode, the electronic device 10 may unexpectedly shut down without providing a notification related to low power associated with the electronic device 10.

Figure 4C:
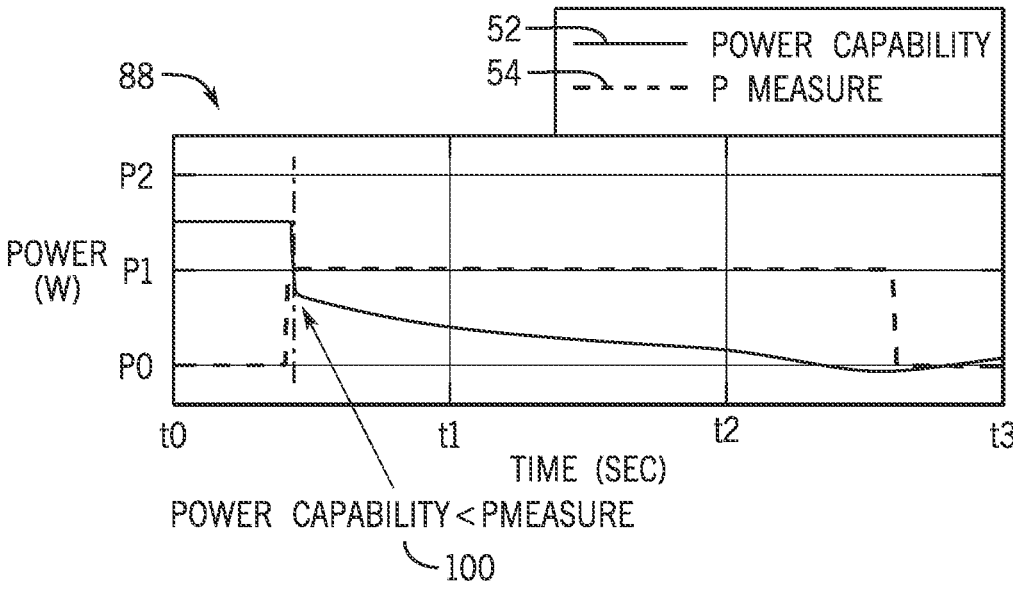
FIG. 4C illustrates power and voltage graphs associated with a battery of the electronic device of FIG. 1 regulating battery power before a voltage measurement is less than a cutoff voltage.
Figure 4C:
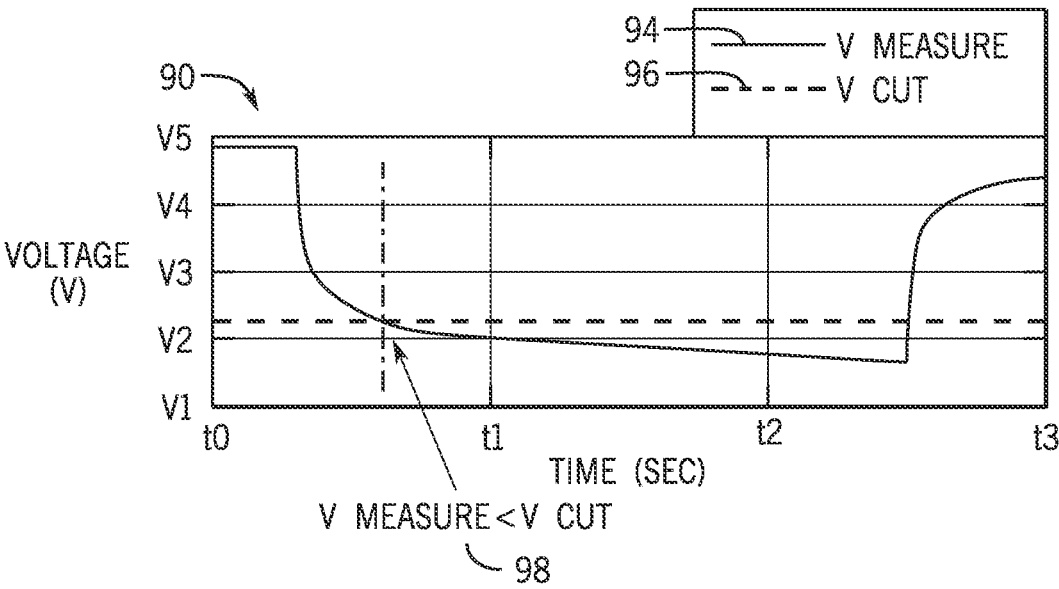

FIG. 4C illustrates a power graph 88 and a voltage graph 90 associated with the battery 29 based on regulating battery power before the voltage measurement 94 is less than or equal to the cutoff voltage 96, according to embodiments of the present disclosure. That is, the processor 12 may regulate power over a period of time (e.g., 2, 3, 5 seconds) before the voltage measurement 94 is equal to or less than the cutoff voltage 96 (e.g., while the voltage measurement 94 is greater than the cutoff voltage 96). As illustrated in the power graph 88 and the voltage graph 90, the intersection 100 (e.g., when power capability 52 begins to decrease such that the reduced power capability 52 is less than the power measurement 54) occurs before the intersection 98 (e.g., when the voltage measurement 94 begins to decrease such that the voltage measurement 94 is less than the cutoff voltage 96). By performing power regulation 58 in advance of the voltage measurement 94 being less than or equal to the cutoff voltage 96 (e.g., intersection 100 occurring before intersection 98), the processor 12 may unnecessarily reduce power supplied by the battery 29. For example, if a user is video-calling using the electronic device 10, and the processor 12 regulates the battery power (e.g., decreases power capability 52) before the voltage measurement 94 is less than or equal to the cutoff voltage 96, then user experience related to video-calling may be impacted (e.g., reducing quality of the video call). By regulating battery power in advance of the intersection 98, the processor 12 may cause the electronic device 10 to unnecessarily operate in a low power mode (e.g., reducing quality of the video call to conserve power) even though the battery 29 is associated with a sufficient charge for video-calling in a normal power mode. That is, the processor 12 unnecessarily regulates and decreases the power capability 52 and prematurely sends a low power notification, even though the voltage measurement 94 is greater than the cutoff voltage 96 and the power capability 52 is greater than the power measurement 54.

Figure 5:
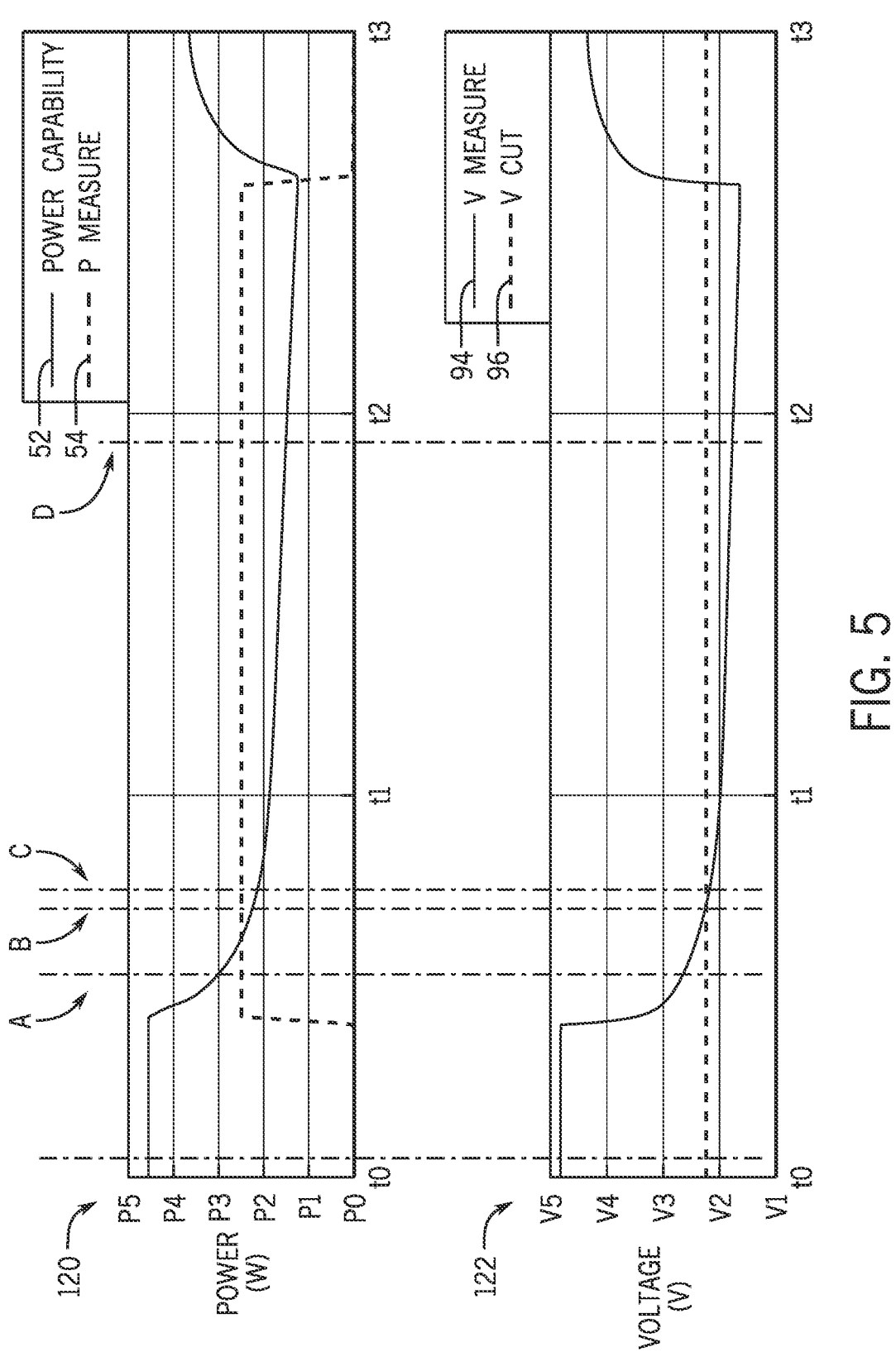
FIG. 5 illustrates power and voltage graphs associated with a battery of the electronic device of FIG. 1 based on regulating battery power relative to different stages of a voltage measurement compared to a cutoff voltage, according to embodiments of the present disclosure.

To prevent under-engagement of power regulation 58 as depicted in FIG. 4B and over-engagement of power regulation 58 as depicted in FIG. 4C, the processor 12 may appropriately implement power regulation 58 based on evaluating the voltage measurement 94 relative to the cutoff voltage 96. Accordingly, FIG. 5 illustrates a power graph 120 and a voltage graph 122 associated with regulating power relative to different stages of the voltage measurement 94 compared to the cutoff voltage 96. As illustrated at point A, when the voltage measurement 94 is greater than the cutoff voltage 96, the processor 12 may not perform power regulation 58. The processor 12 may receive or determine a power capability 52 that is greater than the power measurement 54 when the voltage measurement 94 is greater than the cutoff voltage 96. That is, the processor 12 may operate the battery 29 to supply up to a maximum or the maximum of the power capability 52 and cause the electronic device 10 to perform operations in a normal power mode without power regulation 58 when the voltage measurement 94 is greater than the cutoff voltage 96.

At point B, when the voltage measurement 94 is approximately equal to the cutoff voltage 96, the processor 12 may perform power regulation 58 (e.g., operate the battery 29 to supply up to a maximum or the maximum of the power capability 52 with an applied correction factor) such that the power capability 52 is also approximately equal to the power measurement 54. That is, the processor 12 may correct the power capability 52 such that the difference in magnitude between the power capability 52 with the applied correction factor and the power measurement 54 equals the difference in magnitude between the voltage measurement 94 and the cutoff voltage 96.

At point C, when the voltage measurement 94 is equal to the cutoff voltage 96, the processor 12 may perform power regulation 58 (e.g., operate the battery 29 to supply up to a maximum or the maximum of the power capability 52 with an applied correction factor) such that the power capability 52 with the applied correction factor is lower (e.g., slightly lower) than the power measurement 54 by a threshold amount. Reducing the power capability 52 such that the reduced power capability 52 is less than the power measurement 54 by a small threshold amount (e.g., 1%, 5%, 10%) may prevent the voltage measurement 94 from dropping below the cutoff voltage 96.

At point D, when the voltage measurement 94 is less than the cutoff voltage 96, the processor 12 may perform power regulation 58 (e.g., operate the battery 29 to supply up to a maximum or the maximum of the power capability 52 with an applied correction factor) such that the power capability 52 with the applied correction factor is lower (e.g., significantly lower) than the power measurement 54 by a large threshold amount (e.g., 30%, 50%, 70%). When the power capability 52 with the applied correction factor is much lower than the power measurement 54, the voltage measurement 94 may increase, and thereby prevent unexpected shutdowns of the electronic device 10 that occur when the voltage measurement 94 is less than the cutoff voltage 96 for a period of time.

Figure 6:
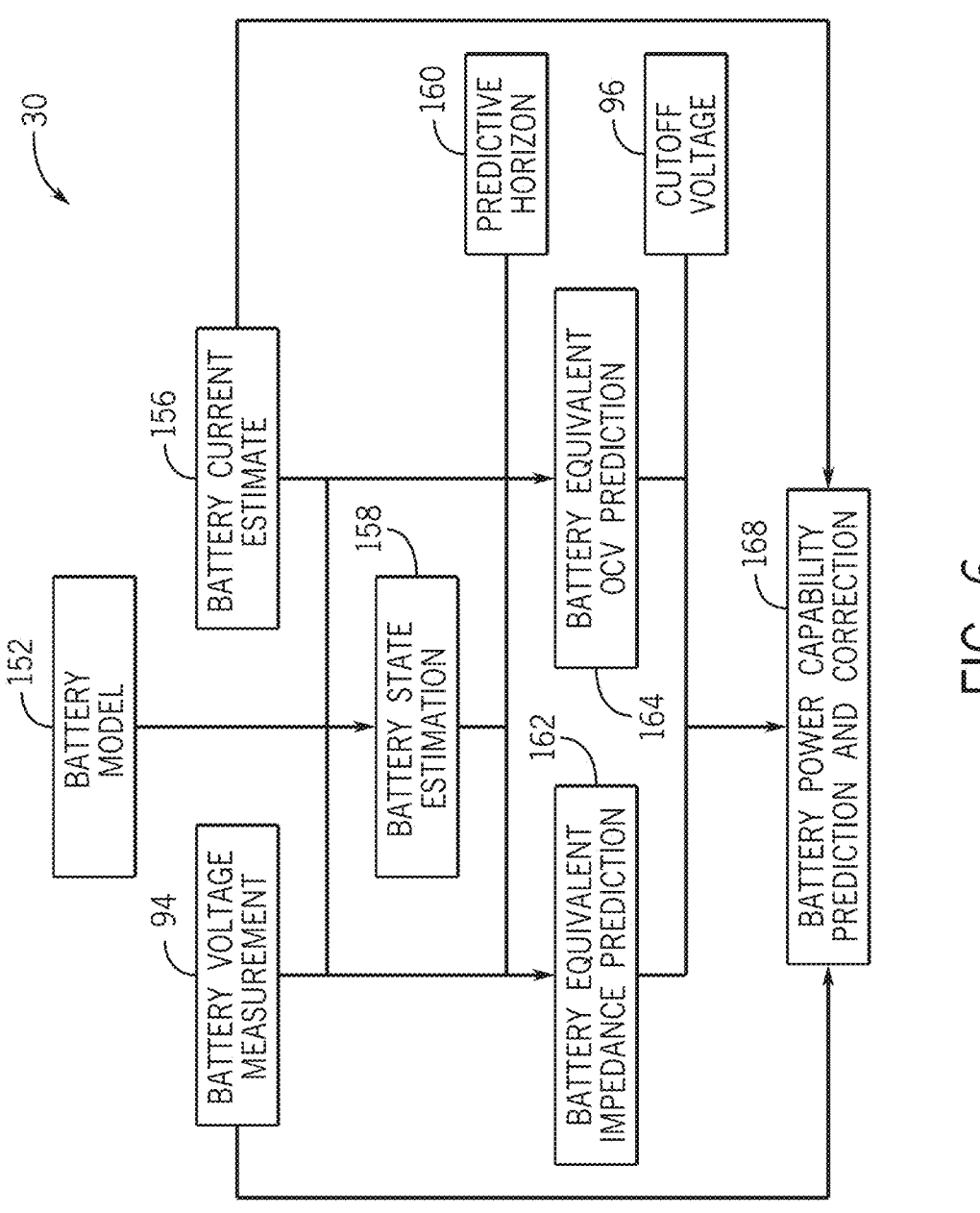
FIG. 6 is a flow diagram associated with determining power capability with an applied correction factor via battery power capability prediction and correction logic implemented by the electronic device of FIG. 1, according to embodiments of the present disclosure.

When the voltage measurement 94 is less than or equal to the cutoff voltage 96, the processor 12 regulates battery power according to the battery power capability prediction and correction logic 30. FIG. 6 is a flow diagram of inputs and steps implemented by the battery power capability prediction and correction logic 30 to determine the power capability 52 with the applied correction factor 168, according to embodiments of the present disclosure. The battery power capability prediction and correction logic 30 may use a battery model 152 at a given temperature and age of the battery 29, the voltage measurement 94 (e.g., $V_B(t)$), and a current measurement 156 (e.g., $I_B(t)$) associated with the battery 29 to determine a battery state estimation 158. As used herein, the battery model 152 may refer to electrical characteristics of the battery 29 being modeled as an equivalent resistor-capacitor (RC) circuit based on resistor-capacitor (RC) parameters such as resistance, capacitance, and a time constant (e.g., an amount of time to charge or discharge resistor-capacitor component associated with the battery 29). The battery state estimation 158 includes an internal current for each equivalent resistor-capacitor (RC) component associated with the battery 29 (e.g., $i_{R_n}$), as well as the state of charge (e.g., SOC), which is a level of available charge of the battery 29 relative to a charge capability (e.g., maximum charge) of the battery 29.

Using the battery state estimation 158, the voltage measurement 94, the current measurement 156 and a predictive horizon 160 (e.g., $t_s$) as inputs, the battery power capability prediction and correction logic 30 may determine the battery equivalent impedance 162 (e.g., $f(t_s, R_1, \tau_1 \ldots R_n, \tau_n)$) at the predictive horizon 160. Similarly, using the battery state estimation 158, the voltage measurement 94, the current measurement 156 and a predictive horizon 160 as inputs, the battery power capability prediction and correction logic 30 may also determine the battery equivalent open-circuit voltage (EOCV) 164 (e.g., $EOCV=V_B(t)+I_B(t)*g(t_s, R_1, \tau_1 \ldots R_n, \tau_n, \Delta t, V_B(t), I_B(t))$) at the predictive horizon 160. As mentioned above, the predictive horizon 160 refers to a duration of time that the battery 29 is expected to operate by supplying up to a maximum or the maximum of the power capability 52.

Based on the battery equivalent impedance 162, the battery equivalent open-circuit voltage (EOCV) 164, and the cutoff voltage 96 (e.g., $V_{cut}$) serving as inputs, the battery power capability prediction and correction logic 30 may determine power capability 52 with the applied correction factor 168. The power capability 52 with the applied correction factor 168 refers to a maximum amount of power that the battery 29 can supply based on power regulation 58 (e.g., regulating power based on the predictive horizon 160 and the cutoff voltage 96). The power capability 52 with the applied correction factor 168 is determined using the following equations:

$$I_{max}(t) = \frac{EOCV - V_{cut}}{f(t_s, R_1, \tau_1 \ldots R_n, \tau_n)} \quad \text{(Equation 1)}$$

$$I_{max}(t) = \frac{V_B(t) - V_{cut}}{f(t_s, R_1, \tau_1 \ldots R_n, \tau_n)} +$$

$$I_B(t)(a)(g(t_s, R_1, \tau_1 \ldots R_n, \tau_n, \Delta t, V_B(t), I_B(t)), \quad \text{(Equation 2)}$$

$$f(t_s, R_1, \tau_1 \ldots R_n, \tau_n))$$

$$P_{max,s}(t) = V_{cut} * I_{max}(t) \quad \text{(Equation 3)}$$

The battery power capability prediction and correction logic 30 may determine a current capability (e.g., $I_{max}(t)$) based on dividing the difference between the battery equivalent open-circuit voltage (EOCV) 164 and the cutoff voltage 96 by the battery equivalent impedance 162, according to Equation 1. The current capability refers to a maximum amount of current associated with battery 29 given the predictive horizon 160. Equation 1 may be reformulated as Equation 2 by including the voltage measurement 94 and the current measurement 156 with respect to the battery equivalent open-circuit voltage (EOCV) 164. In Equation 2, alpha (a) is calculated by dividing the impedance (e.g., $g(t_s, R_1, \tau_1 \ldots R_n, \tau_n, \Delta t, V_B(t), I_B(t))$) associated with the battery equivalent open-circuit voltage (EOCV) 164 by the battery equivalent impedance 162 (e.g., $f(t_s, R_1, \tau_1 \ldots R_n, \tau_n)$). In turn as depicted by Equation 3, to determine the power capability 52 with the applied correction factor 168, the battery power capability prediction and correction logic 30 may multiply the cutoff voltage 96 and the current capability. It can be appreciated that any suitable number or arrangement of the above described inputs and steps may be used by the battery power capability prediction and correction logic 30 to determine the power capability 52 with the applied correction factor 168.

Figure 7:
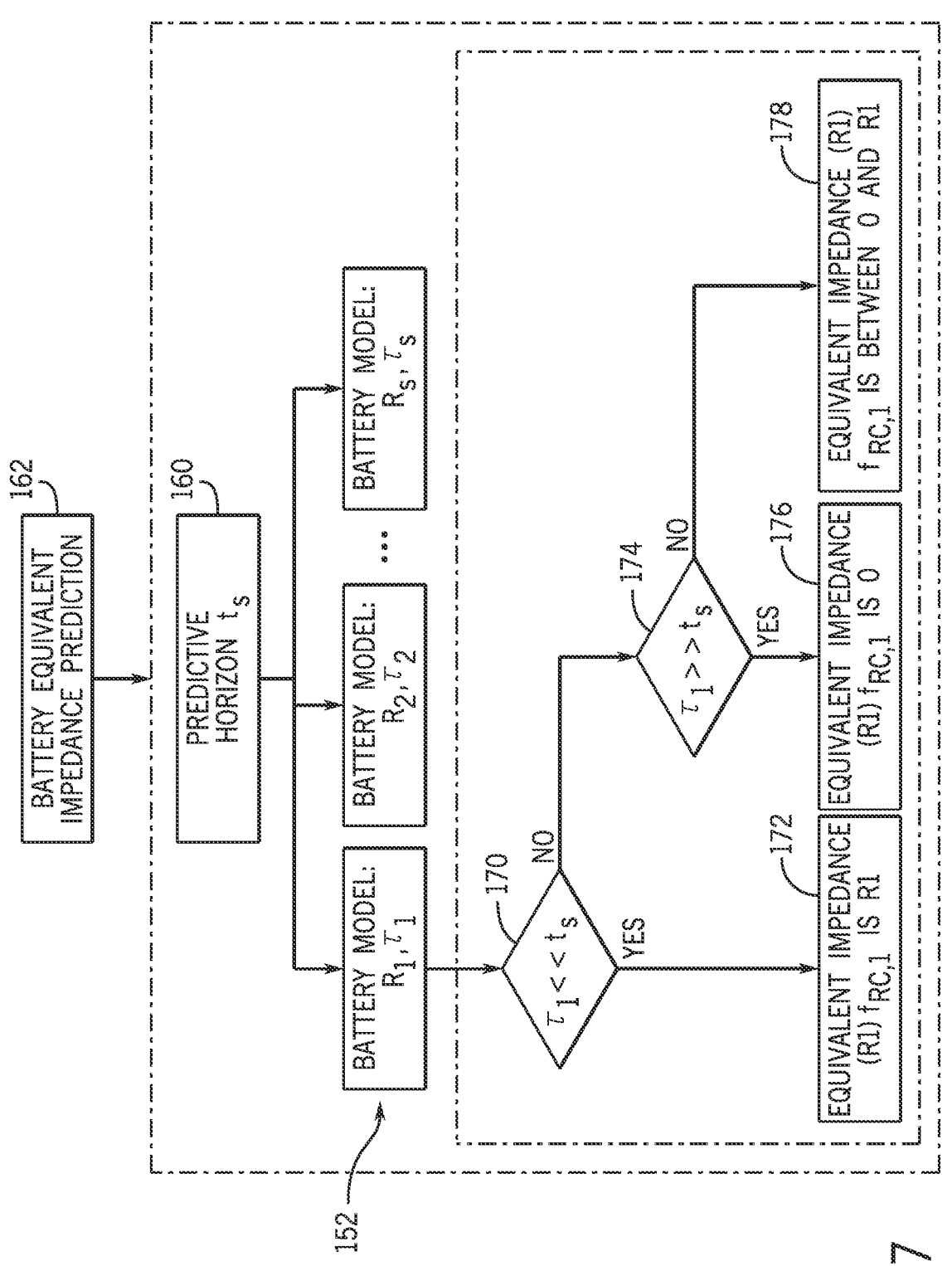
FIG. 7 is a flow diagram associated with determining a battery equivalent impedance via the power capability prediction and correction logic of FIG. 6, according to embodiments of the present disclosure.

FIG. 7 is a flow diagram of inputs and steps applied by the battery power capability prediction and correction logic 30 to determine the battery equivalent impedance 162, which is used to determine the power capability 52 with the applied correction factor 168, according to embodiments of the present disclosure. As used herein, the battery equivalent impedance 162 refers to a resistance and reactance associated with the battery 29 according to the resistor-capacitor (RC) circuit. As mentioned above, using the battery state estimation 158 from the battery model 152 given the predictive horizon 160, the battery power capability prediction and correction logic 30 may determine the battery equivalent impedance 162. The battery power capability prediction and correction logic 30 may compare a time constant based on the battery model 152 and the predictive horizon 160 to determine the battery equivalent impedance 162. As used herein, the time constant (e.g., $\tau_n$) refers to an amount of time to charge or discharge of a resistor-capacitor (RC) component associated with the battery 29. If the time constant is less than the predictive horizon 160 (e.g., $\tau_n < 0.1*t_s$) (block 170), then the battery equivalent impedance 162 is equal to an internal resistance value such as R1 (block 172). If the time constant is greater than the predictive horizon 160 (e.g., $\tau_n > 10*t_s$) (block 174), then the battery equivalent impedance 162 is close zero (block 176). If the time constant is equal to the predictive horizon 160 (e.g., $0.1*t_s < \tau_n < 10*t_s$), then the battery equivalent impedance 162 is between zero and the internal resistance value such as R1, R2, R3, and so forth (block 178).

Figure 8:
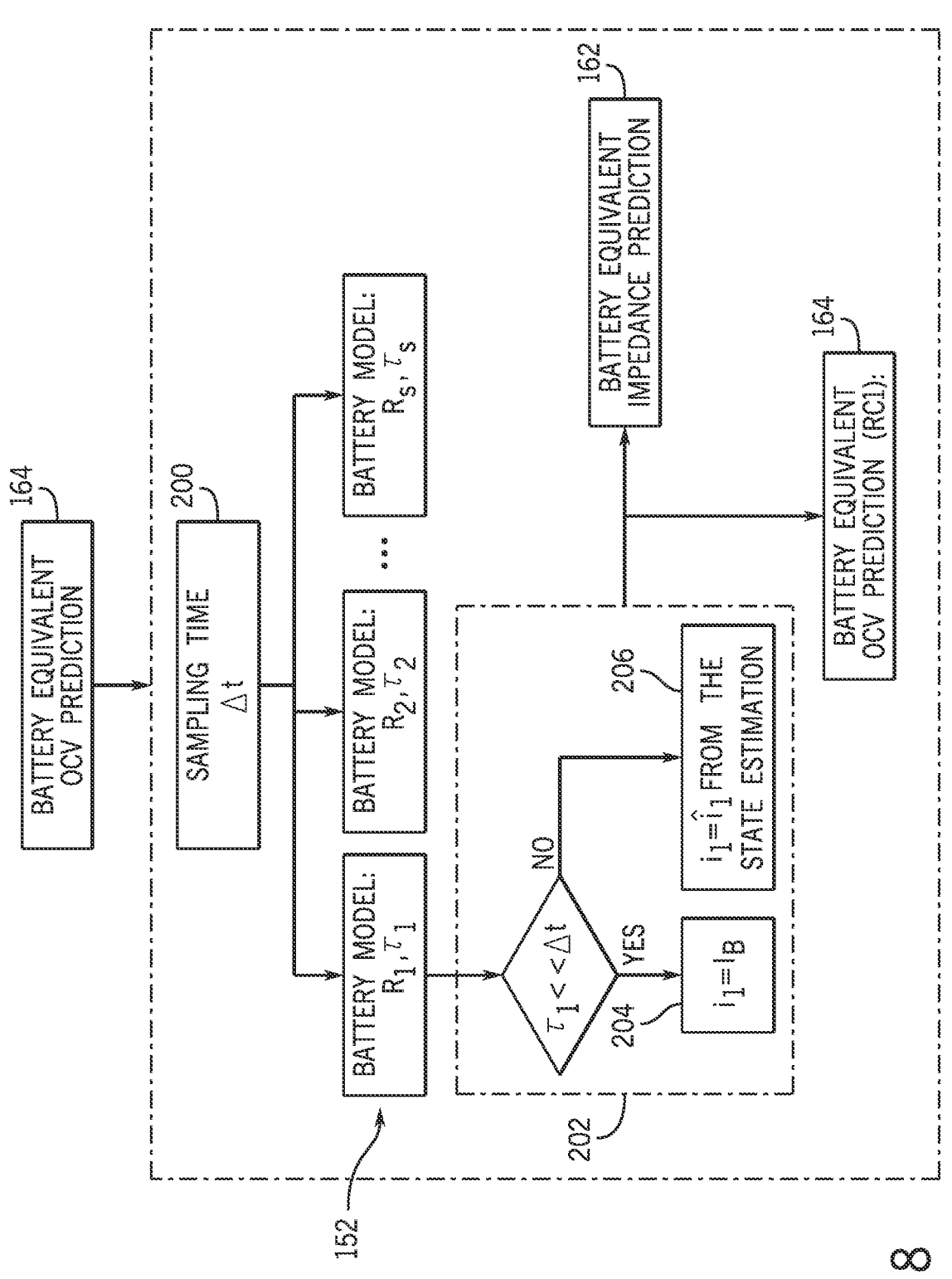
FIG. 8 is a flow diagram associated with determining a battery equivalent open-circuit voltage (EOCV) via the battery power capability prediction and correction logic of FIG. 6, according to embodiments of the present disclosure.

FIG. 8 is a flow diagram of inputs and steps applied by the battery power capability prediction and correction logic 30 to determine the battery equivalent open-circuit voltage (EOCV) 164, which is used to determine the power capability 52 with the applied correction factor 168, according to embodiments of the present disclosure. As used herein, the battery equivalent open-circuit voltage (EOCV) 164 refers to a potential difference between positive and negative terminals of the battery 29 without external current flowing between the positive and negative terminals, where the potential difference is converted across resistor-capacitor (RC) components associated with the battery. As mentioned above, using the battery state estimation 158 from the battery model 152 given the predictive horizon 160, the battery power capability prediction and correction logic 30 may determine the battery equivalent open-circuit voltage (EOCV) 164. The battery power capability prediction and correction logic 30 may compare a sampling time (e.g., $\Delta t$) 200 and the time constant based on the battery model 152 to determine the battery equivalent open-circuit voltage (EOCV) 164 (block 202). As used herein, the sampling time 200 refers to a period of time for determining a state of charge associated with the power source based on the resistor-capacitor (RC) circuit. If the time constant is less than the sampling time 200 (e.g., $\tau_n < 0.1*\Delta t$), then the internal current of the battery 29 equals the current measurement 156 (block 204), and the resistor-capacitor (RC) component associated with the battery may reach steady state (e.g., when the time constant is about 4 or 5). If the time constant in not less than the sampling time 200, then the internal current of the battery 29 equals the current from the battery state estimation 158 according to the resistor-capacitor (RC) circuit (block 206). Based on the internal current of the battery 29 and the battery equivalent impedance 162, the battery power capability prediction and correction logic 30 may determine the battery equivalent open-circuit voltage (EOCV) 164.

Despite impedance errors, the above described algorithm (e.g., battery power capability prediction and correction logic 30) precisely determines the power capability 52 and/or power capability 52 with the applied correction factor 168. For example, even with varying errors (e.g., −20% error, +20% error, −50% error, +50% error), the battery power capability prediction and correction logic 30 effectively regulates battery power as soon as the voltage measurement 94 is less than or equal to the cutoff voltage 96.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. An electronic device comprising:
   a power source; and
   at least one processor communicatively coupled to the power source, wherein the at least one processor is configured to:
   receive a voltage measurement and a cutoff voltage associated with the power source, wherein the cutoff voltage is associated with power regulation of the power source;
   determine a power capability of the power source with an applied correction factor based at least in part on the cutoff voltage, the voltage measurement, a predictive horizon indicative of a duration of time that the power source is expected to operate by supplying up to a maximum of the power capability or the power capability with the applied correction factor, and an equivalent impedance derived from a comparison between the predictive horizon and a time constant indicative of an amount of time to fully charge or fully discharge a resistor-capacitor (RC) component associated with the power source; and operate the power source to supply up to the maximum of the power capability with the applied correction factor.

2. The electronic device of claim 1, wherein the at least one processor is configured to receive a power measurement and operate the power source to supply up to the maximum of the power capability with the applied correction factor such that the power capability with the applied correction factor is less than the power measurement by a first threshold amount based at least in part on determining that the voltage measurement is less than the cutoff voltage.

3. The electronic device of claim 2, wherein the at least one processor is configured to operate the power source to supply up to the maximum of the power capability with the applied correction factor such that the power capability with the applied correction factor is less than the power measurement by a second threshold amount less than the first threshold amount based at least in part on determining that the voltage measurement is equal to the cutoff voltage.

4. The electronic device of claim 1, wherein the at least one processor is configured to receive a power measurement and operate the power source to supply up to the maximum of the power capability with the applied correction factor such that the power capability with the applied correction factor is within a first threshold amount of the power measurement based at least in part on the voltage measurement being within a second threshold amount of the cutoff voltage, and wherein the first threshold amount and the second threshold amount are equal in magnitude.

5. The electronic device of claim 1, wherein the at least one processor is configured to operate the power source to supply up to the maximum of the power capability with the applied correction factor based at least in part on determining that the voltage measurement is less than or equal to the cutoff voltage.

6. The electronic device of claim 1, wherein the at least one processor is configured to receive a power measurement, the power capability or the power capability with the applied correction factor being greater than the power measurement when the voltage measurement is greater than the cutoff voltage.

7. The electronic device of claim 1, wherein the at least one processor is configured to determine the power capability with the applied correction factor based at least in part on the equivalent impedance, an equivalent open-circuit voltage, and the cutoff voltage associated with the power source.

8. The electronic device of claim 7, wherein the at least one processor is configured to determine the equivalent impedance and the equivalent open-circuit voltage based at least in part on the predictive horizon.

9. The electronic device of claim 1, wherein the at least one processor is configured to determine that:
   the equivalent impedance corresponds to a first equivalent impedance based on the comparison indicating that the time constant is greater than the predictive horizon;
   the equivalent impedance corresponds to a second equivalent impedance based on the comparison indicating that the time constant is less than the predictive horizon; and
   the equivalent impedance corresponds to a third equivalent impedance based on the comparison indicating that time constant is substantially equal to the predictive horizon.

10. The electronic device of claim 9, wherein the second equivalent impedance is substantially equal to an internal resistance value.

11. The electronic device of claim 1, wherein the at least one processor is configured to determine the power capability with the applied correction factor based at least in part on an equivalent open-circuit voltage.

12. A method comprising:
  receiving a voltage measurement and a cutoff voltage associated with a power source, wherein the cutoff voltage is associated with power regulation of the power source;
  determining a power capability of the power source with an applied correction factor based at least in part on the cutoff voltage, the voltage measurement, a predictive horizon indicative of a duration of time that the power source is expected to operate by supplying up to a maximum of the power capability or the power capability with the applied correction factor, and an equivalent impedance derived from a comparison between the predictive horizon and a time constant indicative of an amount of time to fully charge of fully discharge a resistor-capacitor (RC) component associated with the power source; and
  operating the power source to supply up to the maximum of the power capability with the applied correction factor.

13. The method of claim 12, comprising receiving a power measurement and operating the power source to supply up to the maximum of the power capability with the applied correction factor such that the power capability with the applied correction factor is less than the power measurement by a first threshold amount based at least in part on the voltage measurement being less than the cutoff voltage.

14. The method of claim 13, comprising operating the power source to supply up to the maximum of the power capability with the applied correction factor such that the power capability with the applied correction factor is less than the power measurement by a second threshold amount less than the first threshold amount based at least in part on the voltage measurement being equal to the cutoff voltage.

15. The method of claim 12, comprising receiving a power measurement and operating the power source to supply up to the maximum of the power capability with the applied correction factor such that the power capability with the applied correction factor is within a first threshold amount of the power measurement based at least in part on the voltage measurement being within a second threshold amount of the cutoff voltage, and wherein the first threshold amount and the second threshold amount are equal in magnitude.

16. The method of claim 12, comprising determining, based on the comparison indicating that the time constant is less than the predictive horizon, that the equivalent impedance is substantially equal to an internal resistance value.

17. One or more tangible, non-transitory, computer-readable media, comprising computer-executable instructions that, when executed by one or more processors, cause the one or more processors to:
  receive a voltage measurement and a cutoff voltage associated with a power source, wherein the cutoff voltage is associated with power regulation of the power source;
  determine a power capability of the power source with an applied correction factor based at least in part on the cutoff voltage, the voltage measurement, a predictive horizon indicative of a duration of time that the power source is expected to operate by supplying up to a maximum of the power capability or the power capability with the applied correction factor, and an equivalent impedance derived from a comparison between the predictive horizon and a time constant indicative of an amount of time to fully charge or fully discharge a resistor-capacitor (RC) component associated with the power source; and
  operate the power source to supply up to the maximum of the power capability with the applied correction factor.

18. The one or more tangible, non-transitory computer-readable media of claim 17, wherein the instructions, when executed by one or more processors, cause the one or more processors to operate the power source to supply up to the maximum of the power capability with the applied correction factor based at least in part on the voltage measurement being less than or equal to the cutoff voltage.

19. The one or more tangible, non-transitory computer-readable media of claim 17, wherein the instructions, when executed by one or more processors, cause the one or more processors to determine the power capability with the applied correction factor based at least in part on the equivalent impedance, an equivalent open-circuit voltage, and the cutoff voltage associated with the power source.

20. The one or more tangible, non-transitory computer-readable media of claim 17, wherein the instructions, when executed by one or more processors, cause the one or more processors to determine, based on the comparison indicating that the time constant is less than the predictive horizon, that the equivalent impedance is substantially equal to an internal resistance value.

* * * * *